United States Patent
Ryu et al.

(10) Patent No.: US 12,048,144 B2
(45) Date of Patent: Jul. 23, 2024

(54) SEMICONDUCTOR MEMORY DEVICE

(71) Applicant: SK hynix Inc., Gyeonggi-do (KR)

(72) Inventors: Seung Wook Ryu, Gyeonggi-do (KR); Wan Sup Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/839,593

(22) Filed: Jun. 14, 2022

(65) Prior Publication Data
US 2023/0164981 A1    May 25, 2023

(30) Foreign Application Priority Data
Nov. 19, 2021   (KR) .................. 10-2021-0160546

(51) Int. Cl.
*H10B 12/00*   (2023.01)

(52) U.S. Cl.
CPC .................. *H10B 12/36* (2023.02)

(58) Field of Classification Search
CPC ........ H10B 12/36; H10B 12/05; H10B 12/30; H10B 12/0335; H10B 12/48; H10B 12/10–50; H10B 12/20; H10B 12/31; H10B 12/312; H10B 12/315; H10B 12/318; H10B 12/33; H10B 12/34; H10B 12/37; H10B 12/373; H10B 12/377; H10B 12/39; H10B 12/395; H10B 12/482; H10B 12/485; H10B 12/488; H10B 12/056; H01L 27/11273; H01L 27/1128; H01L 27/11514; H01L 27/11578; H01L 27/11582; H01L 27/11597; H01L 27/2481; H01L 27/249; H01L 25/0657; H01L 27/0688; G11C 11/4023; G11C 11/408

See application file for complete search history.

(56) References Cited

U.S. PATENT DOCUMENTS

| | | | |
|---|---|---|---|
| 10,607,995 B2 | 3/2020 | Roberts et al. | |
| 2020/0098783 A1* | 3/2020 | Ohtori | H10B 43/27 |
| 2021/0012828 A1* | 1/2021 | Kim | G11C 11/4097 |
| 2022/0352104 A1* | 11/2022 | Hou | H01L 25/18 |

* cited by examiner

Primary Examiner — Mohammad A Rahman
(74) Attorney, Agent, or Firm — IP & T GROUP LLP

(57) ABSTRACT

A semiconductor memory device includes: a conductive line stack including a plurality of first conductive lines that are stacked over a substrate in a direction perpendicular to a surface of the substrate; conductive pads extending laterally from edge portions of the first conductive lines, respectively; and contact plugs coupled to the conductive pads, respectively.

21 Claims, 14 Drawing Sheets

SEMICONDUCTOR MEMORY DEVICE

CROSS-REFERENCE TO RELATED APPLICATIONS

The present application claims priority of Korean Patent Application No. 10-2021-0160546, filed on Nov. 19, 2021, which is incorporated herein by reference in its entirety.

BACKGROUND

1. Field

Embodiments of the present invention relate to a semiconductor device, and more particularly, to a semiconductor memory device including three-dimensional (3D) memory cells.

2. Description of the Related Art

In order to increase the net die of a memory device, the size of memory cells has decreased. As the size of memory cells is miniaturized, it is necessary to reduce the parasitic capacitance (Cb) and increase the capacitance. However, it is difficult to increase the net die due to the structural limitation of the memory cells.

Recently, three-dimensional semiconductor memory devices including three-dimensionally arranged memory cells are being proposed.

SUMMARY

Embodiments of the present invention are directed to a semiconductor memory device including highly integrated memory cells.

In accordance with an embodiment of the present invention, a semiconductor memory device, includes: a conductive line stack including a plurality of first conductive lines that are stacked over a substrate in a direction perpendicular to a surface of the substrate; conductive pads extending laterally from edge portions of the first conductive lines, respectively; and contact plugs coupled to the conductive pads, respectively.

In accordance with another embodiment of the present invention, a semiconductor memory device includes: a plurality of active layers vertically stacked over a substrate; a bit line commonly coupled to first ends of the active layers and extending in a direction perpendicular to a surface of the substrate; capacitors coupled to second ends of the active layers, respectively; a word line stack including double word lines extending laterally in a direction intersecting with each of the active layers are stacked; word line pads laterally extending from edge portions of the double word lines, respectively; and contact plugs coupled to the word line pads, respectively.

In accordance with yet another embodiment of the present invention, a semiconductor memory device includes: a plurality of bit lines vertically stacked in a first direction and laterally oriented in a second direction intersecting with the first direction; bit line pads extending laterally from edge portions of the bit lines; contact plugs coupled to the bit line pads, respectively; active layers laterally oriented in a third direction intersecting with the first and second directions from the bit lines; word lines vertically oriented in the first direction with the active layers interposed therebetween; and capacitors coupled to ends of the active layers, respectively.

In accordance with an embodiment of the present invention, a semiconductor memory device may include: double conductive lines stacked over a substrate in a first direction, each of the double conductive lines including first and second sub-conductive lines parallel to and spaced apart from each other; conductive pads extending laterally in a second direction from a first end of each of the first sub-conductive lines; contact plugs extending in the first direction from landing surfaces of the conductive pads, respectively; and active layers interposed between first and second sub-conductive lines of each of the double conductive lines, wherein a length of the conductive pads gradually changes in the first direction.

DETAILED DESCRIPTION

Figure 1:
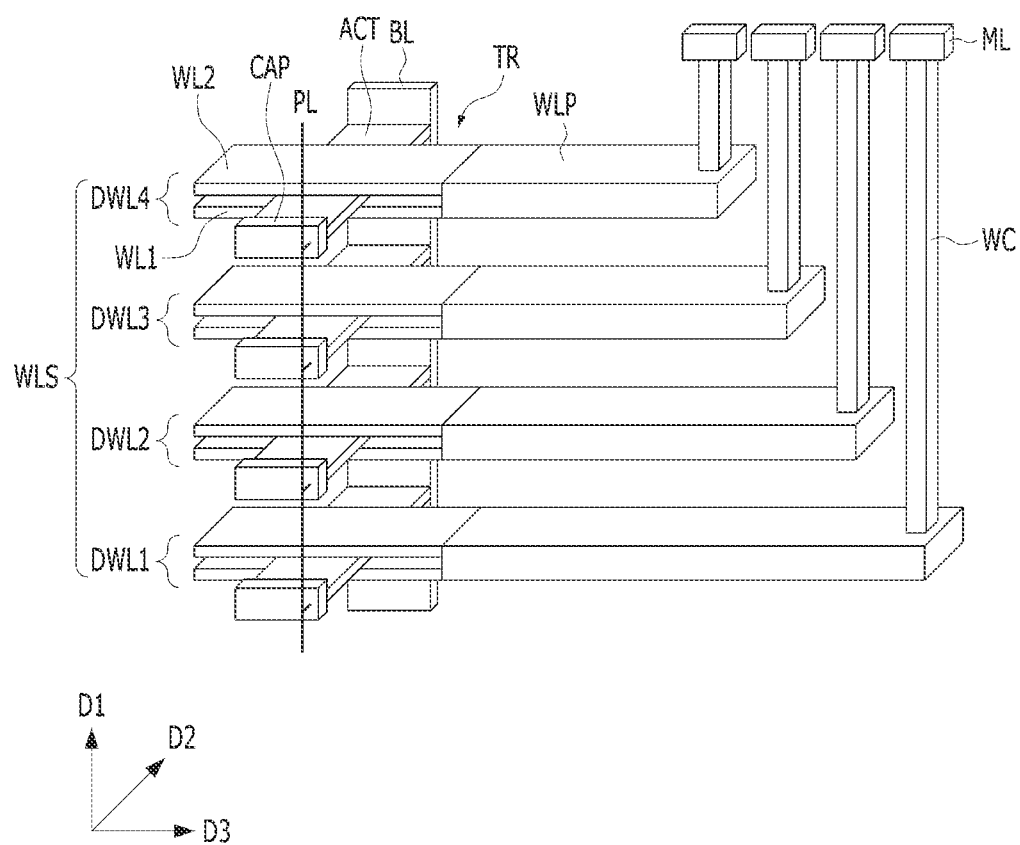
FIG. 1 is a schematic perspective view illustrating a semiconductor memory device in accordance with an embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the embodiments of the present invention described below, memory cell density may be increased and parasitic capacitance may be reduced by vertically stacking memory cells.

Figure 2:
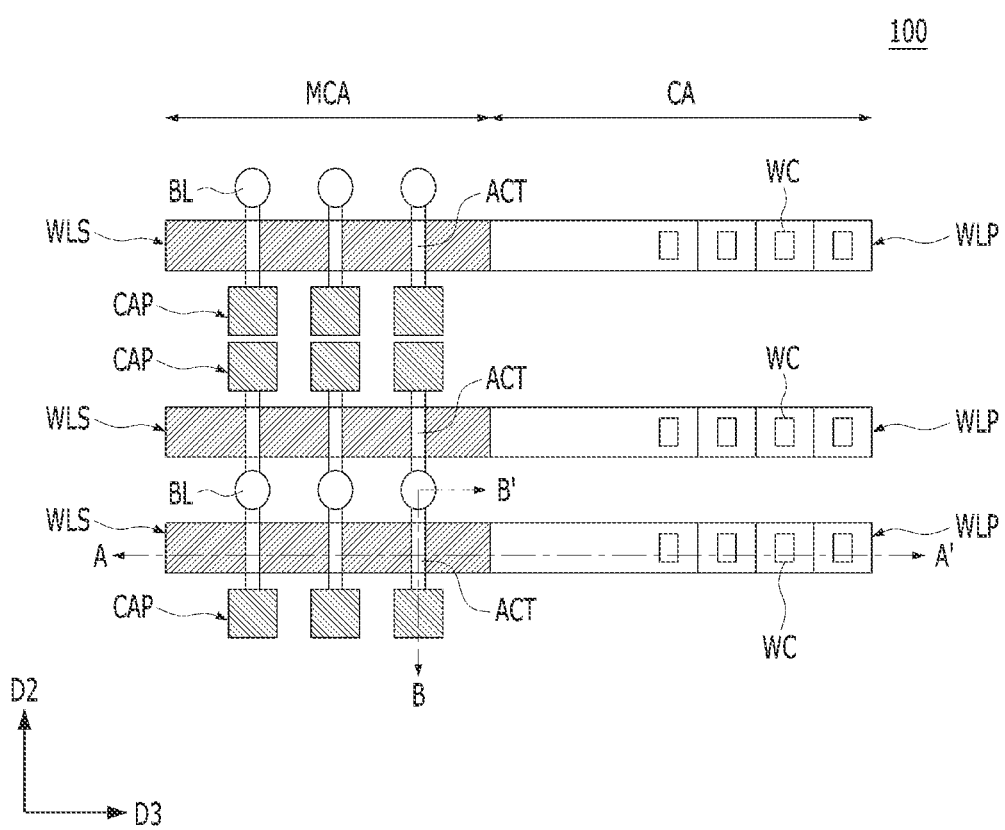
FIG. 2 is a schematic plan view illustrating a semiconductor memory device in accordance with the embodiment of the present invention.
Figure 3:
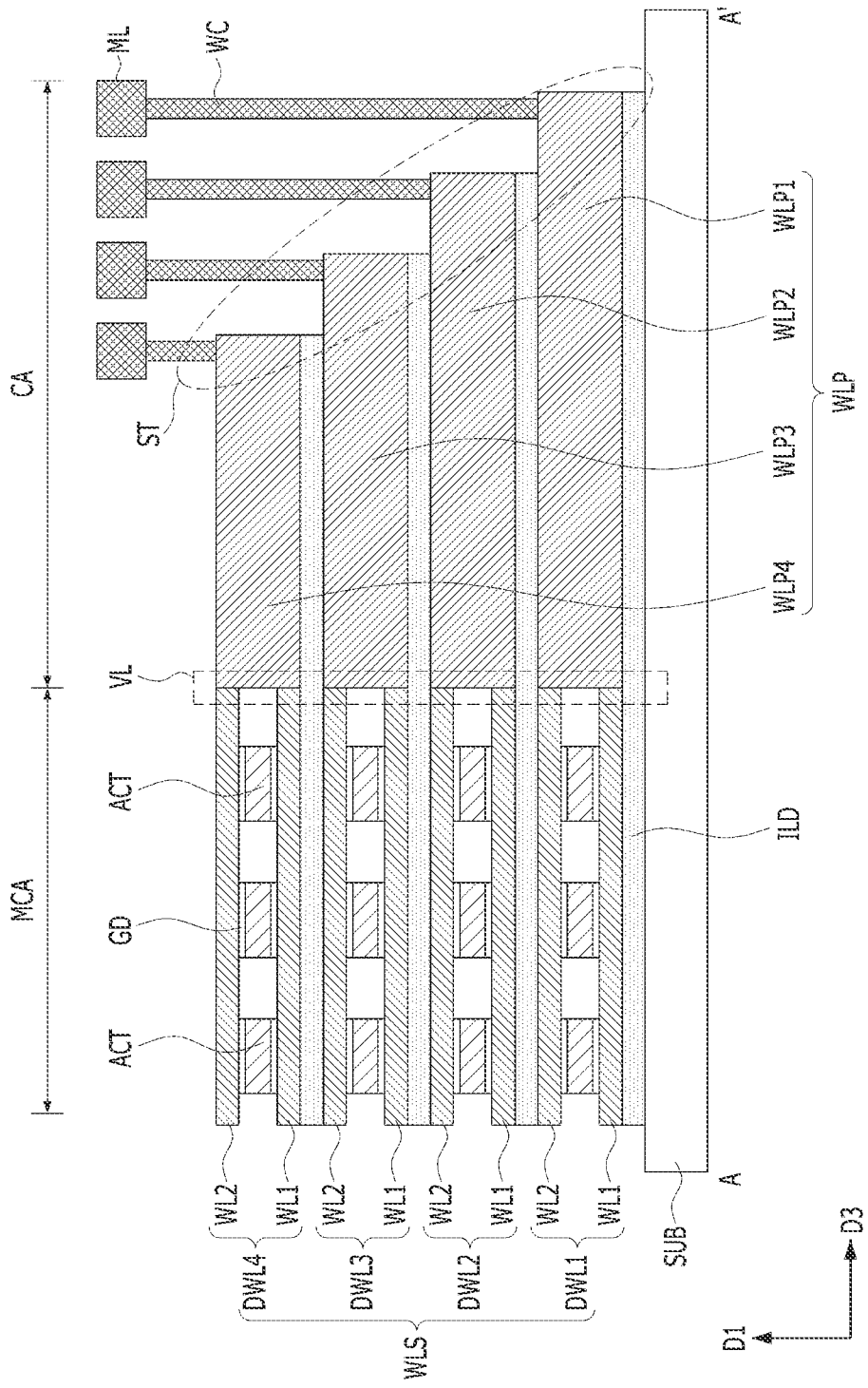
FIG. 3 is a cross-sectional view taken along a line A-A' shown in FIG. 2.
Figure 4:
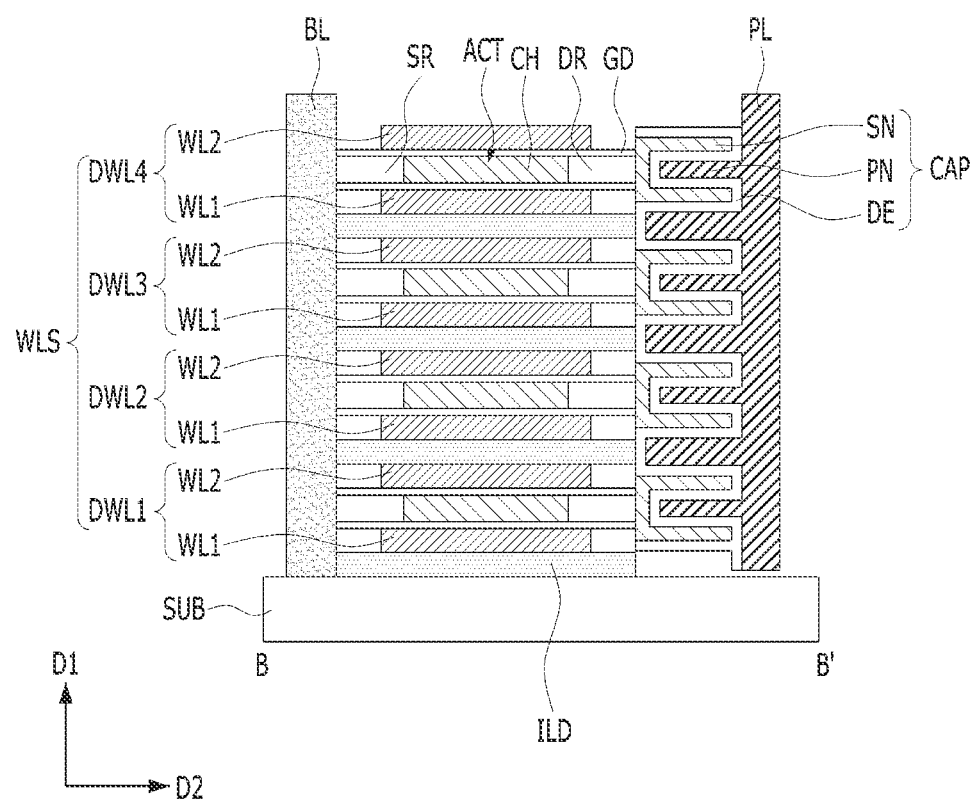
FIG. 4 is a cross-sectional view taken along a line B-B' shown in FIG. 2.

FIG. 1 is a schematic perspective view illustrating a semiconductor memory device in accordance with an embodiment of the present invention. FIG. 2 is a schematic plan view illustrating a semiconductor memory device in accordance with the embodiment of the present invention. FIG. 3 is a cross-sectional view taken along a line A-A' shown in FIG. 2. FIG. 4 is a cross-sectional view taken along a line B-B' shown in FIG. 2.

Referring to FIGS. 1 to 4, the three-dimensional semiconductor memory device 100 in accordance with the embodiment of the present invention may include a conductive line stack WLS including a plurality of first conductive lines DWL1 to DWL4 that are stacked over a substrate SUB in a direction perpendicular to the surface of the substrate SUB, conductive pads WLP extending laterally from edge portions of the first conductive lines DWL1 to DWL4, respectively, contact plugs WC coupled to the conductive pads WLP, respectively, a second conductive line BL extending in the direction perpendicular to the surface of the substrate SUB over the substrate SUB, and active layers ACT laterally oriented in a direction intersecting with the first conductive lines DWL1 to DWL4. Each of the first conductive lines DWL1 to DWL4 may include a pair of a first sub-conductive line WL1 and a second sub-conductive line WL2.

The semiconductor memory device 100 may include a Dynamic Random Access Memory (DRAM) memory cell array. Hereinafter, the first conductive lines DWL1 to DWL4 may correspond to double word lines DWL1 to DWL4, and the second conductive line BL may correspond to a bit line BL. The conductive line stack WLS may be simply referred to as a word line stack WLS, and the conductive pads WLP may be simply referred to as word line pads WLP. The first sub-conductive line WL1 and the second sub-conductive line WL2 may be referred to as a first word line WL1 and a second word line WL2. Accordingly, each of the double word lines DWL1 to DWL4 may include a pair of a first word line WL1 and a second word line WL2.

The semiconductor memory device 100 may include a bit line BL, a transistor TR, and a capacitor CAP. The transistor TR may include an active layer ACT and a double word line DWL, where the double word line DWL may include a first word line WL1 and a second word line WL2 that are opposite to each other with the active layer ACT interposed therebetween. The capacitor CAP may include a storage node SN, a dielectric layer DE, and a plate node PN.

The bit line BL may have a pillar shape extending in a first direction D1. The active layer ACT may have a bar shape extending long in a second direction D2 which intersects with the first direction D1. The double word line DWL may have a line shape extending in a third direction D3 which intersects with the first and second directions D1 and D2. The plate node PN of the capacitor CAP may be coupled to the plate line PL.

The bit line BL may be vertically oriented in the first direction D1. The bit line BL may be referred to as a vertically oriented bit line or a pillar-shaped bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include a TiN/W stack which includes titanium nitride and tungsten over the titanium nitride.

The double word line DWL may extend long in the third direction D3, and the active layer ACT may extend in the second direction D2. The active layer ACT may be laterally arranged in the second direction D2 from the bit line BL. The double word line DWL may include a pair of word lines, that is, the first word line WL1 and the second word line WL2. The first word line WL1 and the second word line WL2 may face each other in the first direction D1 with the active layer ACT interposed therebetween. A gate dielectric layer GD may be formed over the upper and lower surfaces of the active layer ACT.

The active layer ACT may include a semiconductor material or an oxide semiconductor material. For example, the active layer ACT may include silicon, germanium, silicon-germanium, or indium gallium zinc oxide (IGZO). The active layer ACT may include polysilicon or monocrystalline silicon. The active layer ACT may include a channel CH, a first source/drain region SR between the channel CH and the bit line BL, and a second source/drain region DR between the channel CH and the capacitor CAP. The channel CH may be defined between the first source/drain region SR and the second source/drain region DR.

The first source/drain region SR and the second source/drain region DR may be doped with impurities of the same conductivity type. The first source/drain region SR and the second source/drain region DR may be doped with an N-type impurity or a P-type impurity. The first source/drain region SR and the second source/drain region DR may include at least one impurity selected among arsenic (As), phosphorus (P), boron (B), indium (In), and combinations thereof.

The transistor TR may be a cell transistor and may have a double word line DWL. In the double word line DWL, the first word line WL1 and the second word line WL2 may have the same potential. For example, the first word line WL1 and the second word line WL2 may form a pair, and the same word line driving voltage may be applied to the first word line WL1 and the second word line WL2. As described above, according to the embodiment of the present invention, a transistor TR may have a double word line DWL in which two first and second word lines WL1 and WL2 are disposed adjacent to one channel CH.

According to another embodiment of the present invention, the first word line WL1 and the second word line WL2 may have different potentials. For example, a word line driving voltage may be applied to the first word line WL1, and a ground voltage may be applied to the second word line WL2. The second word line WL2 may be referred to as a back word line or a shield word line. According to another embodiment of the present invention, a ground voltage may be applied to the first word line WL1 and a word line driving voltage may be applied to the second word line WL2.

The active layer ACT may have a thickness which is smaller than those of the first and second word lines WL1 and WL2. In other words, a vertical thickness of the active layer ACT in the first direction D1 may be thinner than a vertical thickness of each of the first and second word lines WL1 and WL2 in the first direction D1. The thin active layer ACT may be referred to as a thin-body active layer. The thin active layer ACT may include a thin-body channel CH, and the thin-body channel CH may have a thickness of approximately 10 nm or less. According to another embodiment of the present invention, the channel CH may have the same vertical thickness as the thicknesses of the first and second word lines WL1 and WL2.

The upper and lower surfaces of the active layer ACT may have a flat-surface. In other word, the upper surface and the lower surface of the active layer ACT may be parallel to each other in the second direction D2.

The gate dielectric layer GD may include silicon oxide, silicon nitride, a metal oxide, a metal oxynitride, a metal silicate, a high-k material, a ferroelectric material, an anti-ferroelectric material, or a combination thereof. The gate dielectric layer GD may include $SiO_2$, $Si_3N_4$, $HfO_2$, $Al_2O_3$, $ZrO_2$, AlON, HfON, HfSiO, HfSiON, or HfZrO.

The double word line DWL may include a metal, a metal mixture, a metal alloy, or a semiconductor material. The double word line DWL may include titanium nitride, tungsten, polysilicon, or a combination thereof. For example, the double word line DWL may include a TiN/W stack in which titanium nitride and tungsten are sequentially stacked. The double word line DWL may include an N-type work function material or a P-type work function material. The N-type work function material may have a low work function of approximately 4.5 eV or less, and the P-type work function material may have a high work function of approximately 4.5 eV or more.

The capacitor CAP may be disposed laterally in the second direction D2 from the transistor TR. The capacitor CAP may include a storage node SN extending laterally from the active layer ACT in the second direction D2. The capacitor CAP may further include a dielectric layer DE and a plate node PN over the storage node SN. The storage node SN, the dielectric layer DE, and the plate node PN may be arranged laterally in the second direction D2. The storage node SN may have a laterally oriented cylinder shape. The dielectric layer DE may conformally cover the inner wall and the outer wall of the cylinder shape of the storage node SN. The plate node PN may have a shape extending to the inner wall and the outer wall of the cylinder shape of the storage node SN over the dielectric layer DE. The plate nodes PN of the capacitors CAP may be coupled to each other, and the plate nodes PN may be coupled to the plate line PL. The plate nodes PN and the plate line PL may be collectively referred to as a shared plate node. The storage node SN may be electrically connected to the second source/drain region DR.

The storage node SN may have a three-dimensional structure, and the storage node SN of the three-dimensional structure may have a lateral three-dimensional structure which is oriented in the second direction D2. As an example of the three-dimensional structure, the storage node SN may have a cylinder shape. According to another embodiment of the present invention, the storage node SN may have a pillar shape or a pylinder shape. The pylinder shape may refer to a structure in which a pillar shape and a cylinder shape are merged.

The plate node PN may include an internal node and external nodes. The internal node and the external nodes may be coupled to each other. The internal node may be positioned inside the cylinder shape of the storage node SN. The external nodes may be positioned outside the cylinder shape of the storage node SN with the dielectric layer DE interposed therebetween. The external nodes may be positioned to surround the outer wall of the cylinder shape of the storage node SN.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), titanium nitride/tungsten (TiN/W) stack, or tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material that fills the inside of the cylinder shape of the storage node SN over titanium nitride, and titanium nitride (TiN) may serve as a plate node PN of a capacitor CAP, and tungsten nitride may be a low-resistance material.

The dielectric layer DE may be referred to as a capacitor dielectric layer. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k material.

The dielectric layer DE may be formed of a zirconium (Zr)-based oxide. The dielectric layer DE may have a stack structure including at least zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including at least hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater band gap energy than zirconium oxide ($ZrO_2$) and hafnium oxide ($HfO_2$) (hereinafter referred to as band gap). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material having a greater band gap than the high-k material. The dielectric layer DE may include silicon oxide ($SiO_2$) as a high band gap material other than aluminum oxide ($Al_2O_3$). Since the dielectric layer DE includes a high band gap material, leakage current may be suppressed. The high band gap material may be thinner than the high-k material. According to another embodiment of the present invention, the dielectric layer DE may include a laminated structure in which a high-k material and a high band gap material are alternately stacked. For example, ZAZA ($ZrO_2/Al_2O_3/ZrO_2/Al_2O_3$) stack, ZAZAZ ($ZrO_2/Al_2O_3/ZrO_2/Al_2O_3/ZrO_2$) stack, HAHA ($HfO_2/Al_2O_3/HfO_2/Al_2O_3$) stack, or HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material or an antiferroelectric material.

According to another embodiment of the present invention, an interface control layer (not shown) for improving leakage current may be further formed between the storage node SN and the dielectric layer DE. The interface control layer may include titanium oxide ($TiO_2$), niobium oxide, or niobium nitride. The interface control layer may also be formed between the plate node PN and the dielectric layer DE.

The capacitor CAP may include a MIM (metal-insulator-metal) capacitor. The storage node SN and the plate node PN may include a metal-based material.

The capacitor CAP may be replaced with another data storage material. For example, the data storage material may be a phase change material, a magnetic tunnel junction (MTJ), or a variable resistance material.

Referring back to FIGS. 1, 2, and 3, the semiconductor memory device 100 may include a word line stack WLS, and the word line stack WLS may include a plurality of double word lines DWL1 to DWL4. The double word lines DWL1 to DWL4 may be vertically stacked in the first direction D1. The double word lines DWL1 to DWL4 may extend laterally in the third direction D3.

The semiconductor memory device 100 may include a memory cell array MCA and a contact area CA. A word line stack WLS may be positioned in the memory cell array MCA, and a word line pad portion WLP may be positioned in the contact area CA. The memory cell array MCA may include a plurality of memory cells, and the memory cells may be vertically stacked in the first direction D1. Each memory cell may include a bit line BL, a transistor TR, and a capacitor CAP. In the memory cell array MCA, a plurality of transistors TR may be stacked in the first direction D1. In the memory cell array MCA, a plurality of capacitors CAP may be stacked in the first direction D1. In the memory cell array MCA, the bit line BL may extend vertically in the first direction D1. In the memory cell array MCA, the double word lines DWL1 to DWL4 may extend laterally in the third direction D3.

Referring back to FIG. 3, the word line pad portion WLP may include a first edge portion VL and a second edge portion ST. The first edge portion VL of the word line pad portion WLP may be coupled to an end of the word line stack WLS, and the second edge portion ST of the word line pad portion WLP may have a stepwise shape. A plurality of word line pads WLP1 to WLP4 may be positioned in the contact area CA. The word line pads WLP1 to WLP4 may extend laterally in the third direction D3. The lateral length may gradually increase as it goes from the lowermost word line pad WLP1 to the uppermost word line pad WLP4. Contact plugs WC may be respectively coupled to the word line pads WLP1 to WLP4, and metal lines ML may be respectively coupled to the contact plugs WC. The edge portions of the double word lines DWL1 to DWL4 may be self-aligned at the same vertical level. Here, the same vertical level may correspond to the first edge portion VL of the word line pad portion WLP. The first edge portions VL of the word line pads WLP1 to WLP4 may be self-aligned at the same vertical level. Inter-layer dielectric layers ILD may be positioned between the double word lines DWL1 to DWL4. The double word lines DWL1 to DWL4 may have the same lateral length in the third direction D3. The word line pads WLP1 to WLP4 may have different lateral lengths in the third direction D3. The first word line WL1 and the second word line WL2 of each of the double word lines DWL1 to DWL4 may be thinner than the word line pads WLP1 to WLP4. For example, when vertical heights in the first direction D1 are compared, the first word line WL1 and the second word line WL2 may have a thickness which is smaller than those of the word line pads WLP1 to WLP4. Each of the word line pads WLP1 to WLP4 may have a height that couples the first word line WL1 and the second word line WL2 to each other. The inter-layer dielectric layers ILD may be positioned between the vertically stacked word line pads WLP1 to WLP4.

The word line pads WLP1 to WLP4 may be respectively coupled to ends of the double word lines DWL1 to DWL4. For example, the first double word line DWL1 may be coupled to the first word line pad WLP1, and the second double word line DWL2 may be coupled to the second word line pad WLP2. The third double word line DWL3 may be coupled to the third word line pad WLP3, and the fourth double word line DWL4 may be coupled to the fourth word line pad WLP4. The word line pads WLP1 to WLP4 may be simultaneously coupled to the first word line WL1 and the second word line WL2, respectively.

As described above, since thick word line pads WLP are formed, word line resistance may be improved.

The semiconductor memory device 100 may further include a substrate SUB, and the substrate SUB may include a peripheral circuit portion. The bit line BL of the memory cell array MCA may be oriented perpendicular to the surface of the substrate SUB in the first direction D1, and the double word line DWL may be oriented parallel to the surface of the substrate SUB in the third direction D3.

The peripheral circuit portion may be positioned at a lower level than the memory cell array MCA and the contact area CA. This may be referred to as a COP (Cell over Peri) structure. The peripheral circuit portion may include at least one control circuit for driving the memory cell array MCA. The at least one control circuit of the peripheral circuit portion may include an N-channel transistor, a P-channel transistor, a CMOS circuit, or a combination thereof. The at least one control circuit of the peripheral circuit portion may include an address decoder circuit, a read circuit, a write circuit, and the like. The at least one control circuit of the peripheral circuit portion may include a planar channel transistor, a recess channel transistor, a buried gate transistor, a fin channel transistor (FinFET) and the like.

According to another embodiment of the present invention, in the semiconductor memory device 100, the peripheral circuit portion may be positioned at a higher level than the memory cell array MCA. This may be referred to as a POC (Peri over Cell) structure.

Figure 5:
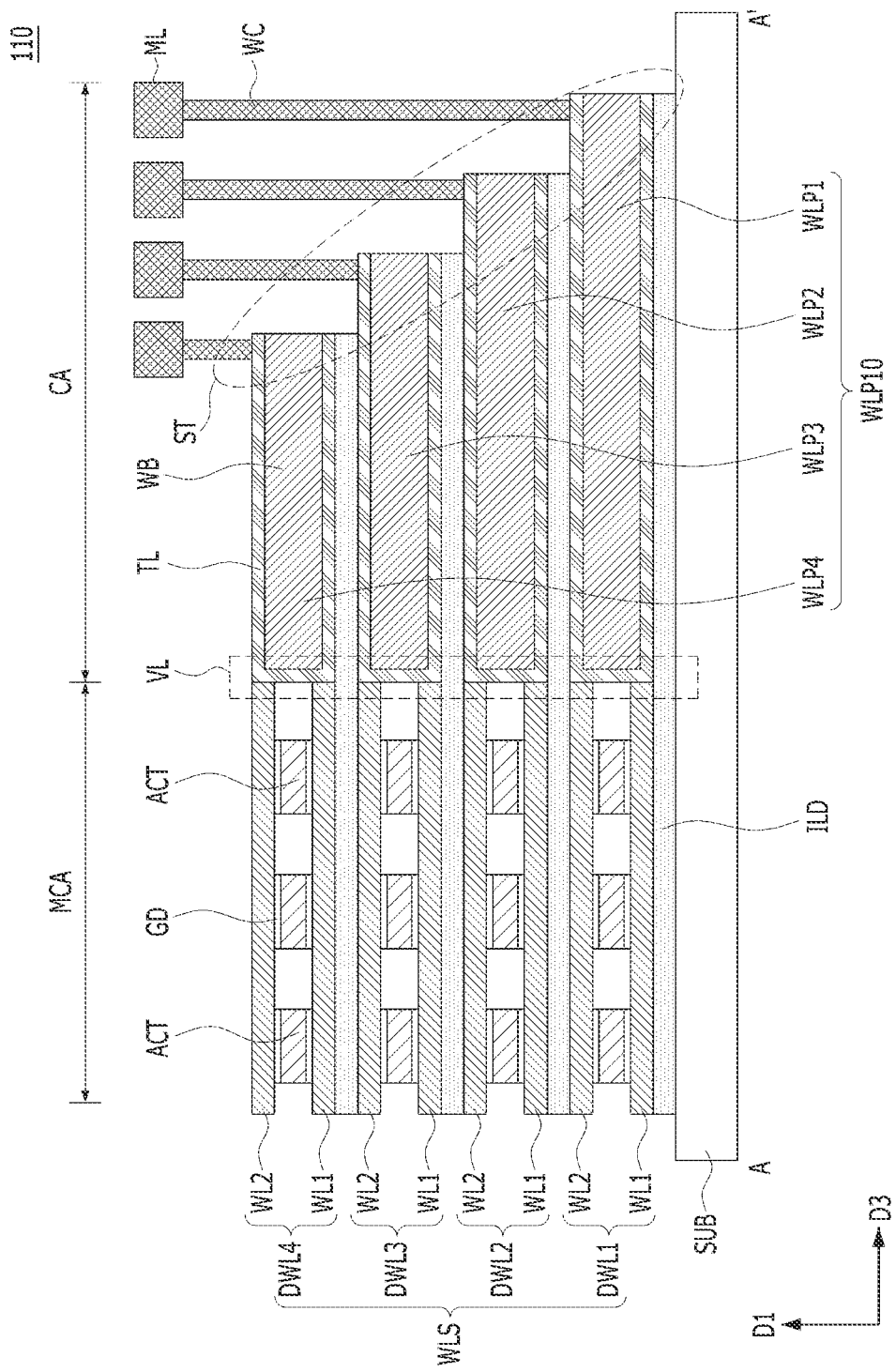
FIGS. 5 to 7 are schematic cross-sectional views illustrating semiconductor memory devices in accordance with other embodiments of the present invention.

FIG. 5 is a schematic cross-sectional view illustrating a semiconductor memory device in accordance with another embodiment of the present invention. In FIG. 5, detailed description on the constituent elements which also appear in FIGS. 1 to 4 will be omitted.

Referring to FIG. 5, the semiconductor memory device 110 may include a word line stack WLS, and the word line stack WLS may include a plurality of double word lines DWL1 to DWL4. The double word lines DWL1 to DWL4 may be vertically stacked in the first direction D1. The double word lines DWL1 to DWL4 may extend laterally in the third direction D3.

The semiconductor memory device 110 may include a memory cell array MCA and a contact area CA. The word line stack WLS may be positioned in the memory cell array MCA, and a word line pad portion WLP10 may be positioned in the contact area CA.

The word line pad portion WLP10 may include a first edge portion VL and a second edge portion ST. The first edge portion VL of the word line pad portion WLP10 may be coupled to an end of the word line stack WLS, and the second edge portion ST of the word line pad portion WLP10 may have a stepwise shape. A plurality of word line pads WLP1 to WLP4 may be positioned in the contact area CA. The word line pads WLP1 to WLP4 may extend laterally in the third direction D3. The lateral length of the word line pads WLP1 to WLP4 may gradually decrease as it goes from the lowermost word line pad WLP1 to the uppermost word line pad WLP4. Contact plugs WC may be respectively coupled to the word line pads WLP1 to WLP4, and the metal lines ML may be respectively coupled to the contact plugs WC. The edge portions of the double word lines DWL1 to DWL4 may be self-aligned at the same vertical level. Inter-layer dielectric layers ILD may be positioned between the double word lines DWL1 to DWL4. The double word lines DWL1 to DWL4 may have the same lateral length in the third direction D3. The word line pads WLP1 to WLP4 may have different lateral lengths in the third direction D3. The first word line WL1 and the second word line WL2 of each of the double word lines DWL1 to DWL4 may be thinner than the word line pads WLP1 to WLP4. For example, when the vertical heights in the first direction D1 are compared, the first word line WL1 and the second word line WL2 may have a thickness which is smaller than those of the word line pads WLP1 to WLP4. Each of the word line pads WLP1 to WLP4 may have a height that couples the first word line WL1 and the second word line WL2 to each other. The inter-layer dielectric layers ILD may be positioned between the vertically stacked word line pads WLP1 to WLP4.

The word line pads WLP1 to WLP4 may be coupled to the ends of the double word lines DWL1 to DWL4, respectively. For example, the first double word line DWL1 may be coupled to the first word line pad WLP1, and the second double word line DWL2 may be coupled to the second word line pad WLP2. The third double word line DWL3 may be coupled to the third word line pad WLP3, and the fourth double word line DWL4 may be coupled to the fourth word line pad WLP4. Each of the word line pads WLP1 to WLP4 may be simultaneously coupled to the first word line WL1 and the second word line WL2 of the corresponding one of the double word lines DWL1 to DWL4.

Each of the word line pads WLP1 to WLP4 may further include a metallic liner TL and a metallic bulk WB. The metallic liner TL and the metallic bulk WB may be electrically coupled to edge portions of the double word lines DWL1 to DWL4. The metallic liner TL may be directly coupled to edge portions of the double word lines DWL1 to DWL4. The metallic liner TL may include titanium nitride, and the metallic bulk WB may include tungsten. The contact plugs WC may directly contact the metallic liner TL. The first and second word lines WL1 and WL2 of the double word lines DWL1 to DWL4 may directly contact the metallic liner TL.

Figure 6:
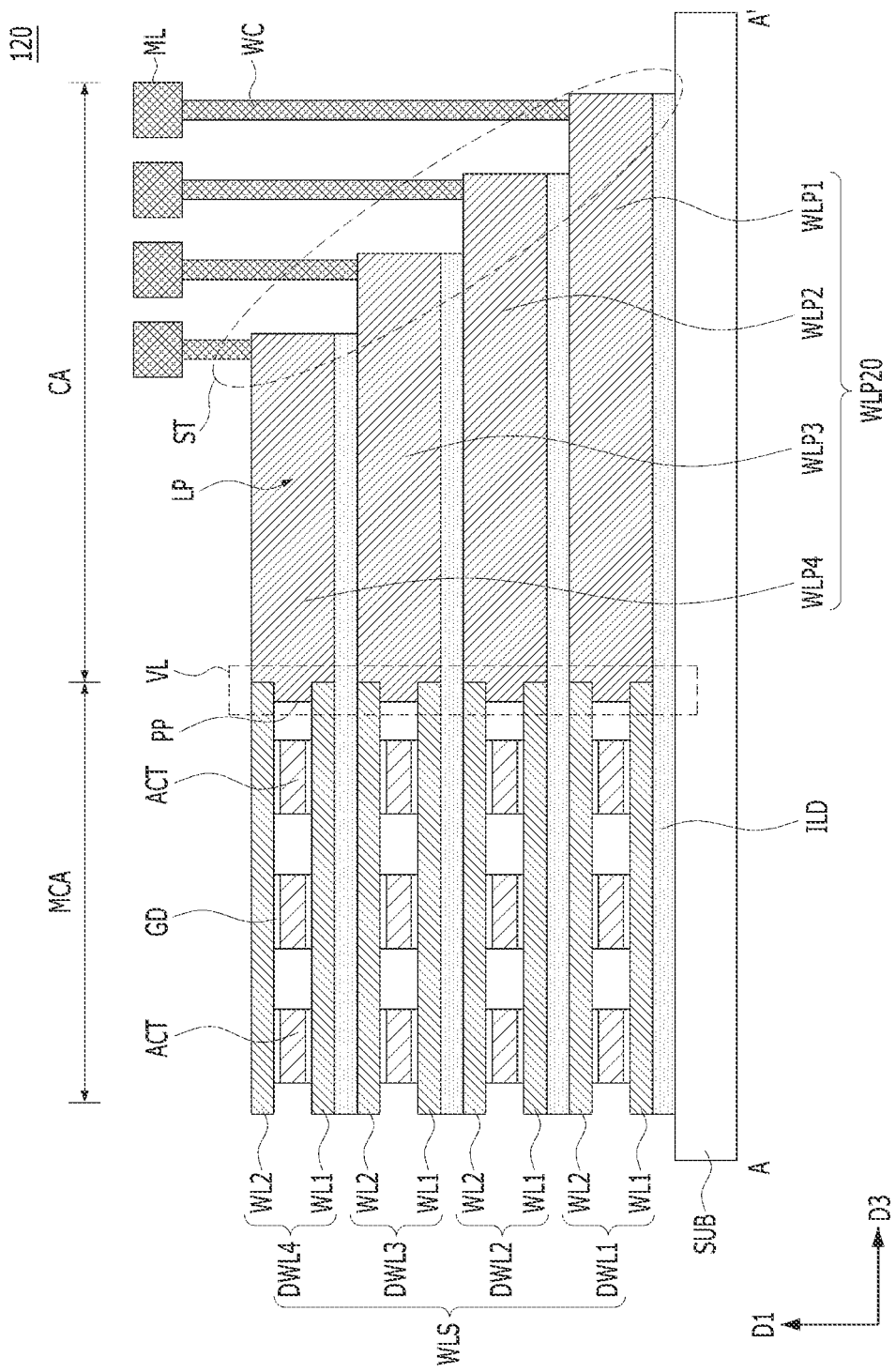

FIG. 6 is a schematic cross-sectional view illustrating a semiconductor memory device 120 in accordance with another embodiment of the present invention. In FIG. 6, detailed descriptions on the constituent elements which also appear in FIGS. 1 to 5 will be omitted.

Referring to FIG. 6, the semiconductor memory device 120 may include a word line stack WLS, and the word line stack WLS may include a plurality of double word lines DWL1 to DWL4. The double word lines DWL1 to DWL4 may be vertically stacked in the first direction D1. The double word lines DWL1 to DWL4 may extend laterally in the third direction D3.

The semiconductor memory device 120 may include a memory cell array MCA and a contact area CA. A word line stack WLS may be positioned in the memory cell array MCA, and a word line pad portion WLP20 may be positioned in the contact area CA.

The word line pad portion WLP20 may include a first edge portion VL and a second edge portion ST. The first edge portion VL of the word line pad portion WLP20 may be coupled to an end of the word line stack WLS, and the second edge portion ST of the word line pad portion WLP20 may have a stepwise shape. A plurality of word line pads WLP1 to WLP4 may be respectively positioned in the contact area CA. The word line pads WLP1 to WLP4 may extend laterally in the third direction D3. The lateral length may gradually decrease as it goes from the lowermost word line pad WLP1 to the uppermost word line pad WLP4. Contact plugs WC may be respectively coupled to the word line pads WLP1 to WLP4, and metal lines ML may be coupled to the contact plugs WC, respectively. The edge portions of the double word lines DWL1 to DWL4 may be self-aligned at the same vertical level. Inter-layer dielectric layers ILD may be positioned between the double word lines DWL1 to DWL4. The double word lines DWL1 to DWL4 may have the same lateral length in the third direction D3. The word line pads WLP1 to WLP4 may have different lateral lengths in the third direction D3. The first word line WL1 and the second word line WL2 of each of the double word lines DWL1 to DWL4 may be thinner than the word line pads WLP1 to WLP4. For example, when vertical heights in the first direction D1 are compared, the first word line WL1 and the second word line WL2 may have a thickness which is smaller than those of the word line pads WLP1 to WLP4. Each of the word line pads WLP1 to WLP4 may have a height that couples the first word line WL1 and the second word line WL2 to each other. The inter-layer dielectric layers ILD may be positioned between the vertically stacked word line pads WLP1 to WLP4.

Each of the word line pads WLP1 to WLP4 may be coupled to an end of each of the double word lines DWL1 to DWL4. For example, the first double word line DWL1 may be coupled to the first word line pad WLP1, and the second double word line DWL2 may be coupled to the second word line pad WLP2. The third double word line DWL3 may be coupled to the third word line pad WLP3, and the fourth double word line DWL4 may be coupled to the fourth word line pad WLP4. Each of the word line pads WLP1 to WLP4 may be simultaneously coupled to the first word line WL1 and the second word line WL2 of the corresponding one of the double word lines DWL1 to DWL4.

Each of the word line pads WLP1 to WLP4 may include a protrusion portion PP and a landing portion LP. The protrusion portions PP may be coupled to the edge portions of the double word lines DWL1 to DWL4. For example, the protrusion portions PP may extend into a gap between an edge portion of the first word line WL1 and an edge portion of the second word line WL2. The contact plugs WC may be coupled to the landing portions LP. The landing portions LP may have a height which is greater than the gap between the edge portion of the first word line WL1 and the edge portion of the second word line WL2 (i.e., a vertical thickness of the protrusion portion).

Figure 7:
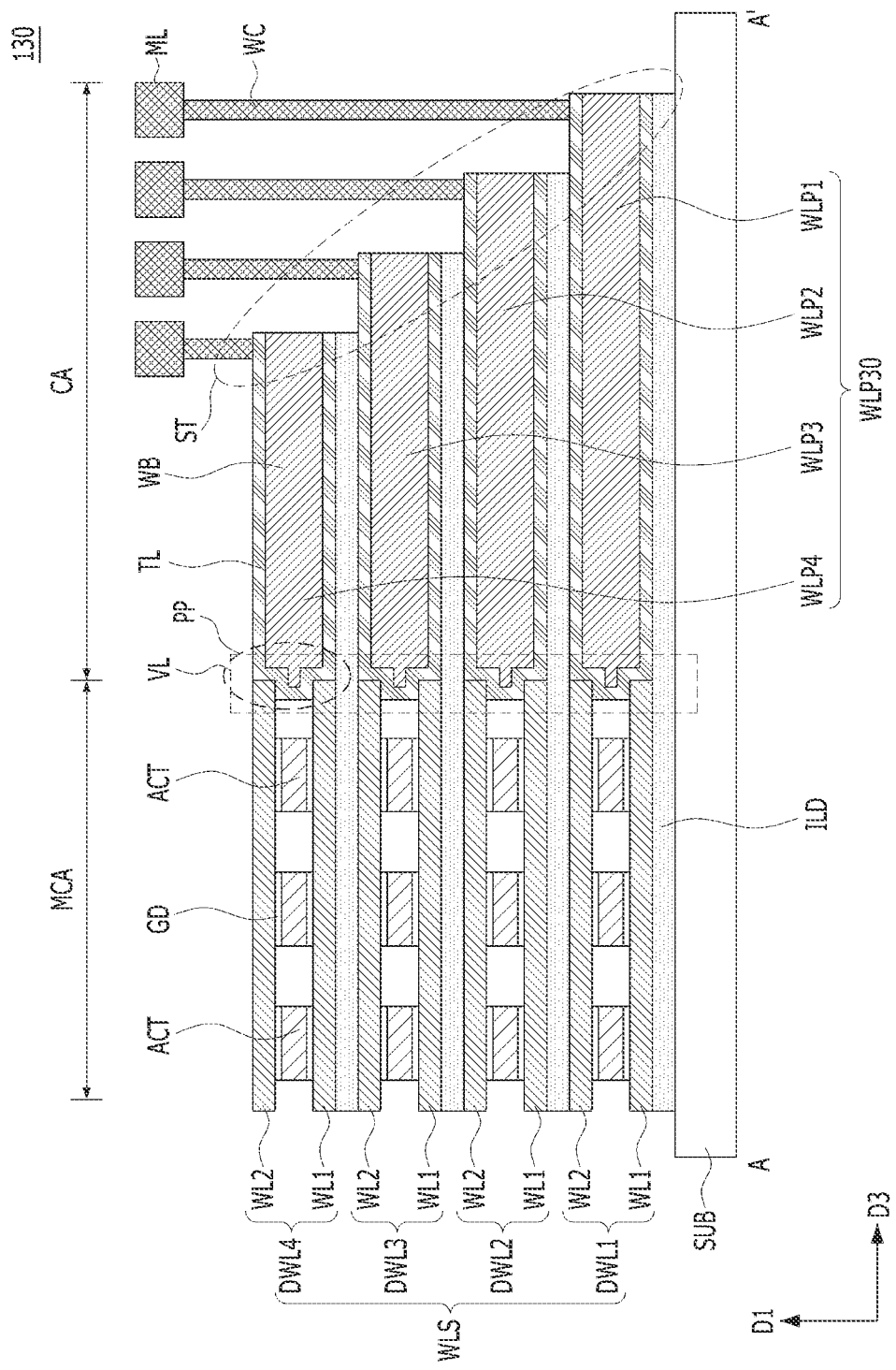

FIG. 7 is a schematic cross-sectional view illustrating a semiconductor memory device in accordance with another embodiment of the present invention. In FIG. 7, detailed description on the constituent elements which also appear in FIGS. 1 to 6 will be omitted.

Referring to FIG. 7, the semiconductor memory device 130 may include a word line stack WLS, and the word line stack WLS may include a plurality of double word lines DWL1 to DWL4. The double word lines DWL1 to DWL4 may be vertically stacked in the first direction D1. The double word lines DWL1 to DWL4 may extend laterally in the third direction D3.

The semiconductor memory device 130 may include a memory cell array MCA and a contact area CA. The word line stack WLS may be positioned in the memory cell array MCA, and a word line pad portion WLP30 may be positioned in the contact area CA.

The word line pad portion WLP30 may include a first edge portion VL and a second edge portion ST. The first edge portion VL of the word line pad portion WLP30 may be coupled to an end of the word line stack WLS, and the second edge portion ST of the word line pad portion WLP30 may have a stepwise shape. A plurality of word line pads WLP1 to WLP4 may be respectively positioned in the contact area CA. The word line pads WLP1 to WLP4 may extend laterally in the third direction D3. The lateral length may gradually decrease as it goes from the lowermost word line pad WLP1 toward the uppermost word line pad WLP4. Contact plugs WC may be respectively coupled to the word line pads WLP1 to WLP4, and metal lines ML may be coupled to the contact plugs WC, respectively. The edge portions of the double word lines DWL1 to DWL4 may be self-aligned at the same vertical level. Inter-layer dielectric layers ILD may be positioned between the double word lines DWL1 to DWL4. The double word lines DWL1 to DWL4 may have the same lateral length in the third direction D3. The word line pads WLP1 to WLP4 may have different lateral lengths in the third direction D3. The first word line WL1 and the second word line WL2 of each of the double word lines DWL1 to DWL4 may be thinner than the word line pads WLP1 to WLP4. For example, when the vertical heights in the first direction D1 are compared, the first word line WL1 and the second word line WL2 may have a thickness which is smaller than those of the word line pads WLP1 to WLP4. Each of the word line pads WLP1 to WLP4 may have a height that couples the first word line WL1 and the second word line WL2 to each other. Inter-layer dielectric layers ILD may be positioned between the vertically stacked word line pads WLP1 to WLP4.

Each of the word line pads WLP1 to WLP4 may be coupled to an end of each of the double word lines DWL1 to DWL4. For example, the first double word line DWL1 may be coupled to the first word line pad WLP1, and the second double word line DWL2 may be coupled to the second word line pad WLP2. The third double word line DWL3 may be coupled to the third word line pad WLP3, and the fourth double word line DWL4 may be coupled to the fourth word line pad WLP4. The word line pads WLP1 to WLP4 may be simultaneously coupled to the first word line WL1 and the second word line WL2.

Each of the word line pads WLP1 to WLP4 may include a protrusion portion PP and a landing portion LP. The protrusion portions PP may be coupled to the edge portions of the double word lines DWL1 to DWL4. For example, the protrusion portions PP may extend into a space between an edge portion of the first word line WL1 and an edge portion of the second word line WL2. Contact plugs WC may be coupled to the landing portions LP.

Each of the word line pads WLP1 to WLP4 may further include a metallic liner TL and a metallic bulk WB. The metallic liner TL and the metallic bulk WB may be electrically coupled to the edge portions of the double word lines DWL1 to DWL4. The metallic liner TL may be directly coupled to the edge portions of the double word lines DWL1 to DWL4. The metallic liner TL may include titanium nitride, and the metallic bulk WB may include tungsten. The contact plugs WC may directly contact the metallic liner TL. The first and second word lines WL1 and WL2 of the double word lines DWL1 to DWL4 may directly contact the metallic liner TL.

Figure 8:
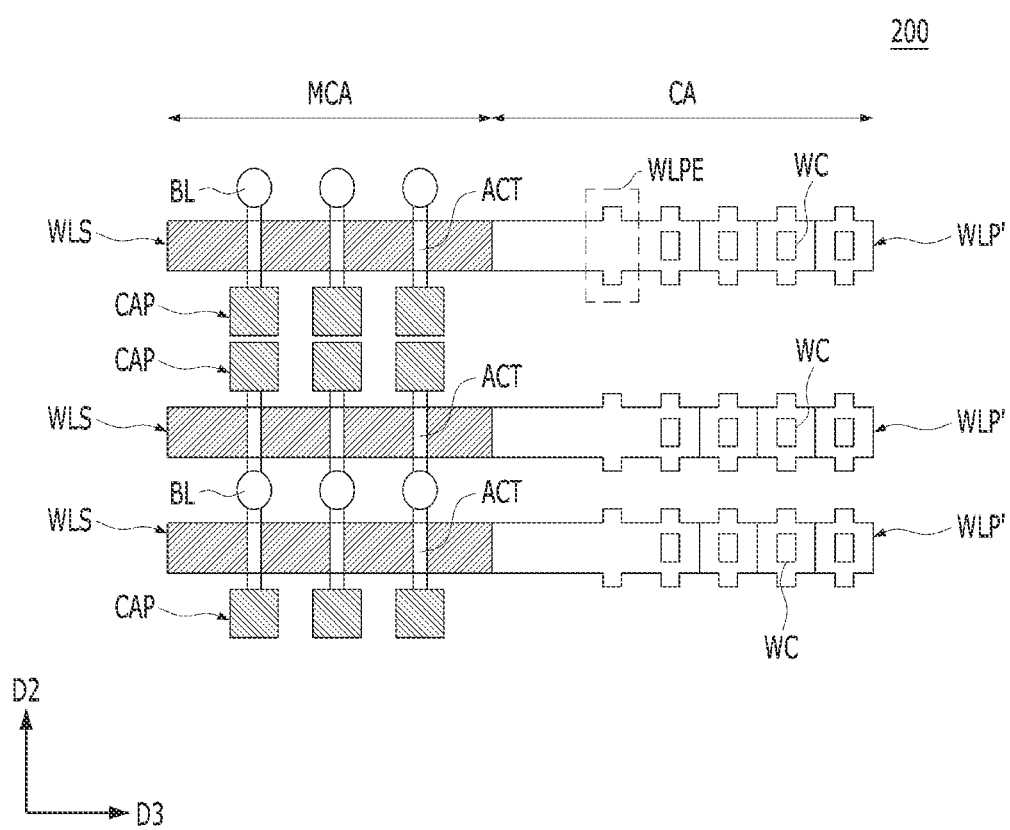
FIG. 8 is a schematic plan view illustrating a semiconductor memory device in accordance with another embodiment of the present invention.

FIG. 8 is a schematic plan view illustrating a semiconductor memory device in accordance with another embodiment of the present invention.

Referring to FIGS. 1, 2, 3, and 8, the semiconductor memory device 200 may include a word line stack WLS, and the word line stack WLS may include a plurality of double word lines DWL1 to DWL4. The double word lines DWL1 to DWL4 may be vertically stacked in the first direction D1. The double word lines DWL1 to DWL4 may extend laterally in the third direction D3.

The semiconductor memory device 200 of FIG. 8 may include a memory cell array MCA and a contact area CA. The word line stack WLS may be positioned in the memory cell array MCA, and a word line pad portion WLP' may be positioned in the contact area CA.

The word line pad portion WLP' may include a plurality of word line pads (WLP1 to WLP4 shown in FIG. 3). From the perspective of a top view, the word line pad portion WLP' may have a cross shape WLPE, and thus structural stability of the word line pad portion WLP' may be secured.

According to the above-described embodiments, since thick word line pads are formed, the resistance of the double word lines may be improved.

In order to form the word line pads WLP1 to WLP4, the sacrificial materials between the inter-layer dielectric layers ILD may be removed from the contact area CA to form a gap, and then the gap may be filled with a metallic material. Here, the sacrificial materials may include a nitride, monocrystalline silicon, polysilicon, or a combination thereof. The inter-layer dielectric layers ILD may include silicon oxide. For example, a method of forming the word line pads WLP1 to WLP4 in the contact area CA may include repeatedly forming a mold stack where a first inter-layer dielectric layer, a first sacrificial layer, a silicon layer, a second sacrificial layer, and a second inter-layer dielectric are stacked in the mentioned order, forming a slit by etching the mold stack, forming a gap by selectively removing the first sacrificial layer, the silicon layer, and the second sacrificial layer through a slit, and forming a metallic material to fill the gap. The method of forming the double word lines DWL1 to DWL4 in the memory cell array MCA may include repeatedly forming a mold stack where a first inter-layer dielectric layer, a first sacrificial layer, a silicon layer, a second sacrificial layer, and a second inter-layer dielectric are stacked in the mentioned order, forming a slit by etching the mold stack, forming a gap in the upper and lower portions of the silicon layer by selectively removing the first sacrificial layer and a portion of the second sacrificial layer through the slit, forming a gate dielectric layer on a surface of the silicon layer exposed by the gaps, and forming first and second word lines WL1 and WL2 filling the gaps over the gate dielectric layer. After the mold stack is repeatedly formed, double word lines DWL1 to DWL4 of the memory cell array MCA may be formed, and then word line pads WLP1 to WLP4 may be formed in the contact area CA. In the mold stack, the first and second sacrificial layers may include a silicon germanium layer.

Figure 9:
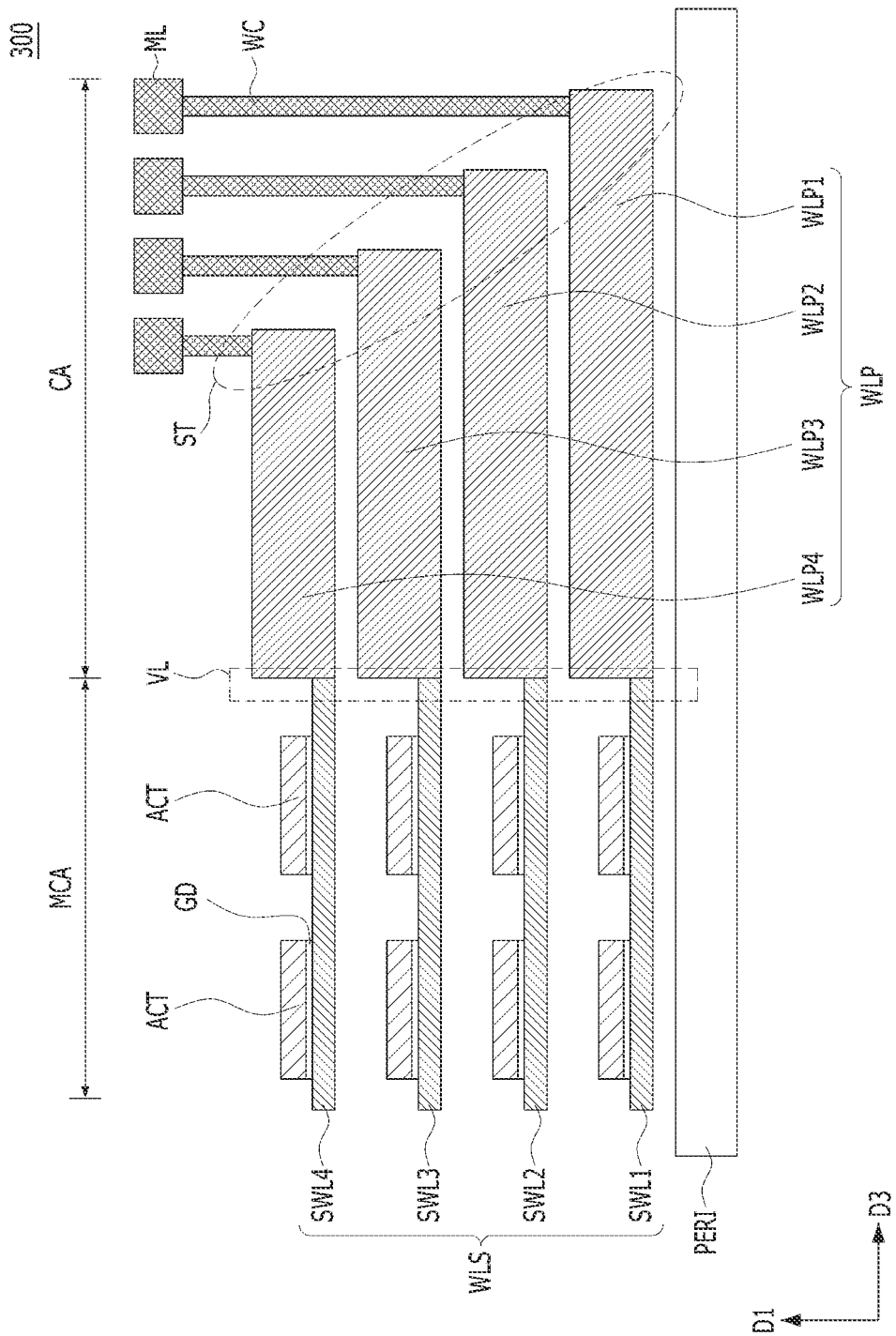
FIGS. 9 and 10 are schematic cross-sectional views illustrating a semiconductor memory device in accordance with another embodiment of the present invention.

FIG. 9 is a schematic cross-sectional view illustrating a semiconductor memory device in accordance with another embodiment of the present invention.

Referring to FIGS. 1, 2, 3, and 9, the semiconductor memory device 300 may include a word line stack WLS, and the word line stack WLS may include a plurality of single word lines SWL1 to SWL4. The single word lines SWL1 to SWL4 may be vertically stacked in the first direction D1. The single word lines SWL1 to SWL4 may extend laterally in the third direction D3. A gate dielectric layer GD may be positioned between the single word lines SWL1 to SWL4 and the active layers ACT.

The semiconductor memory device 300 may include a memory cell array MCA and a contact area CA. The word line stack WLS may be positioned in the memory cell array MCA, and the word line pad portion WLP may be positioned in the contact area CA.

The word line pad portion WLP may include a first edge portion VL and a second edge portion ST. The first edge portion VL of the word line pad portion WLP may be coupled to an end of the word line stack WLS, and the second edge portion ST of the word line pad portion WLP30 may have a stepwise shape. A plurality of word line pads WLP1 to WLP4 may be positioned in the contact area CA. The word line pads WLP1 to WLP4 may extend laterally in the third direction D3. The lateral length may gradually decrease as it goes from the lowermost word line pad WLP1 toward the uppermost word line pad WLP4. Contact plugs WC may be respectively coupled to the word line pads WLP1 to WLP4, and metal lines ML may be coupled to the contact plugs WC, respectively. The edge portions of the single word lines SWL1 to SWL4 may be self-aligned at the same vertical level. Inter-layer dielectric layers (not shown) may be positioned between the single word lines SWL1 to SWL4. The single word lines SWL1 to SWL4 may have the same lateral length in the third direction D3. The word line pads WLP1 to WLP4 may have different lateral lengths in the third direction D3. Each of the single word lines SWL1 to SWL4 may be thinner than the word line pads WLP1 to WLP4. For example, when vertical heights in the first direction D1 are compared, the single word lines SWL1 to SWL4 may have a thickness which is smaller than those of the word line pads WLP1 to WLP4.

Figure 10:
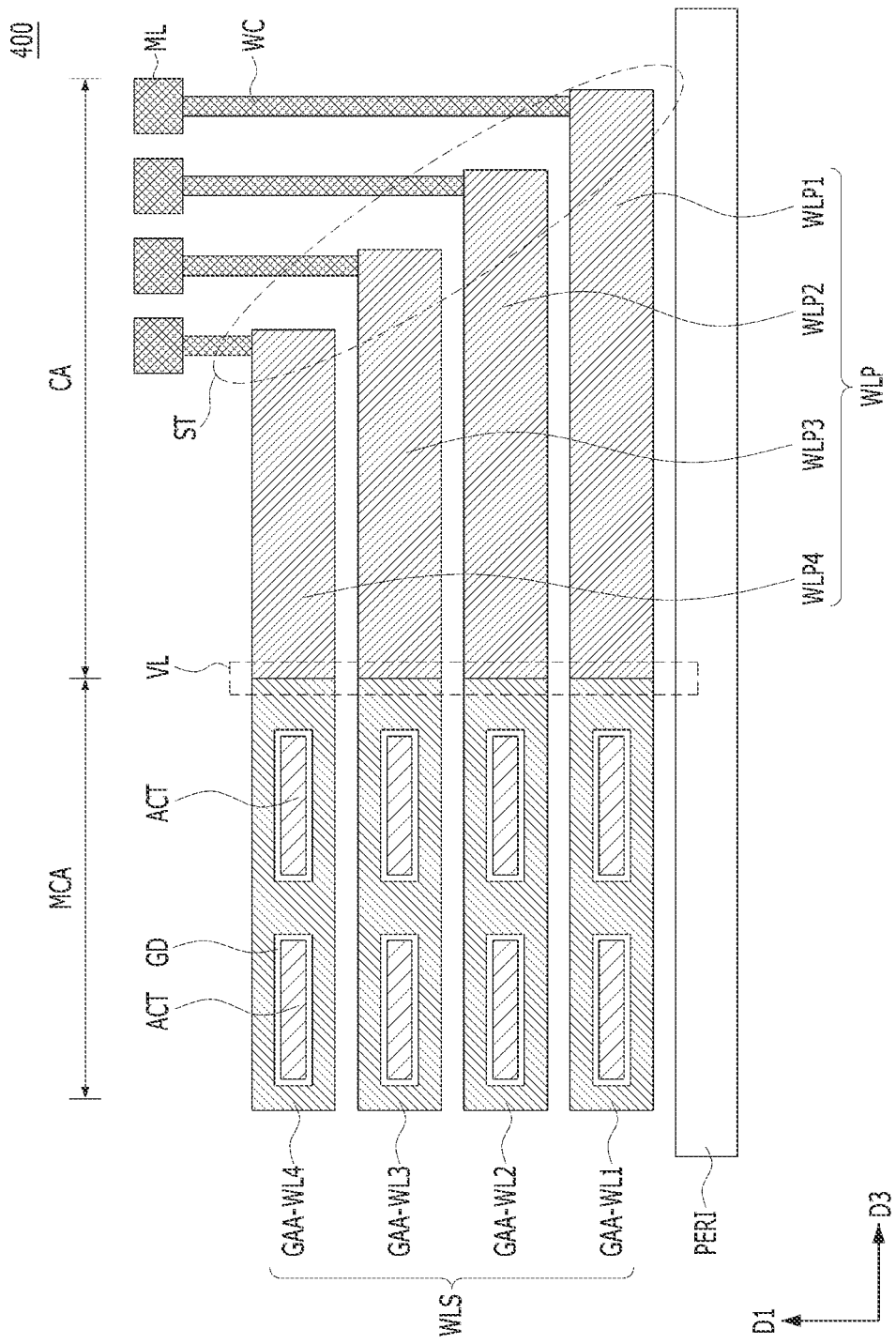

FIG. 10 is a schematic cross-sectional view illustrating a semiconductor memory device 400 in accordance with another embodiment of the present invention.

Referring to FIGS. 1, 2, 3, and 10, the semiconductor memory device 400 may include a word line stack WLS, and the word line stack WLS may include a plurality of gate all-around word lines. (GAA-WL1 to GAA-WL4). The gate all-around word lines GAA-WL1 to GAA-WL4 may be vertically stacked in the first direction D1. The gate all-around word lines GAA-WL1 to GAA-WL4 may extend laterally in the third direction D3. The gate all-around word lines GAA-WL1 to GAA-WL4 may surround the active layers ACT, and the gate dielectric layers GD may surround the active layers ACT.

The semiconductor memory device 400 may include a memory cell array MCA and a contact area CA. The word line stack WLS may be positioned in the memory cell array MCA, and the word line pad portion WLP may be positioned in the contact area CA.

The word line pad portion WLP may include a first edge portion VL and a second edge portion ST. The first edge portion VL of the word line pad portion WLP may be coupled to an end of the word line stack WLS, and the second edge portion ST of the word line pad portion WLP may have a stepwise shape. A plurality of word line pads WLP1 to WLP4 may be positioned in the contact area CA. The word line pads WLP1 to WLP4 may extend laterally in the third direction D3. The lateral length may gradually decrease as it goes from the lowermost word line pad WLP1 toward the uppermost word line pad WLP4. Contact plugs WC may be respectively coupled to the word line pads WLP1 to WLP4, and metal lines ML may be coupled to the contact plugs WC, respectively. The edge portions of the gate-all-around word lines GAA-WL1 to GAA-WL4 may be self-aligned at the same vertical level. Inter-layer dielectric layers (not shown) may be positioned between the gate all-around word lines GAA-WL1 to GAA-WL4. The gate all-around word lines GAA-WL1 to GAA-WL4 may have the same lateral length in the third direction D3. The word line pads WLP1 to WLP4 may have different lateral lengths in the third direction D3. Each of the gate-all-around word lines GAA-WL1 to GAA-WL4 may have the same vertical height as those of the word line pads WLP1 to WLP4.

Figure 11A:
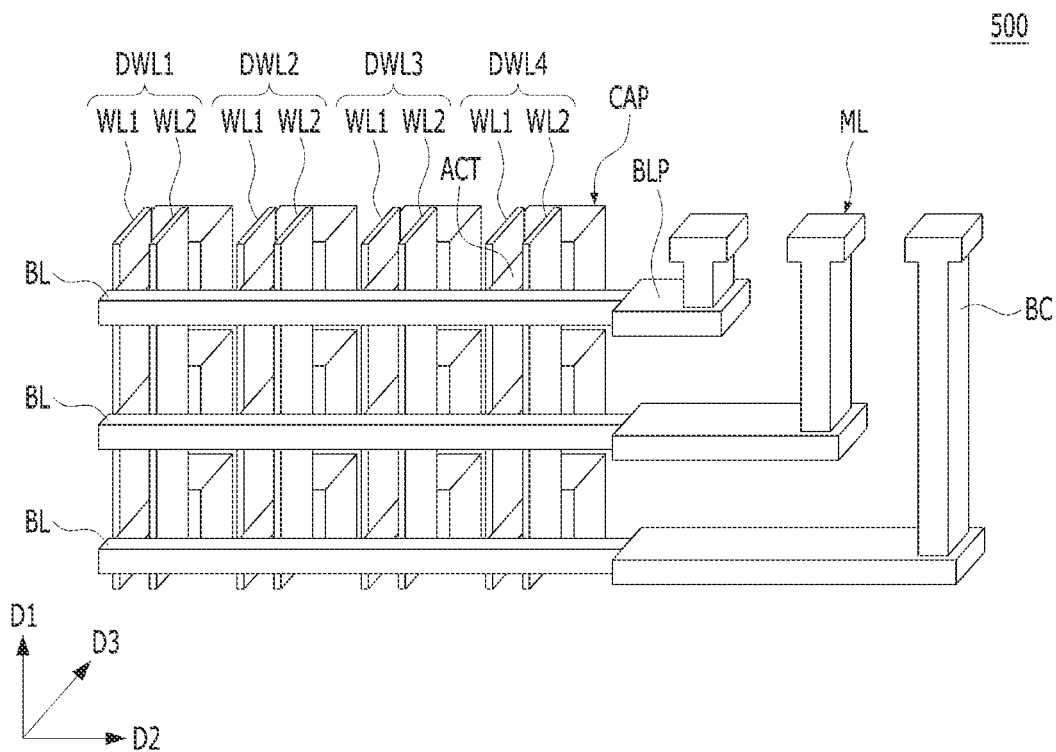
FIGS. 11A and 11B are schematic perspective views illustrating a semiconductor memory device in accordance with another embodiment of the present invention.
Figure 11B:
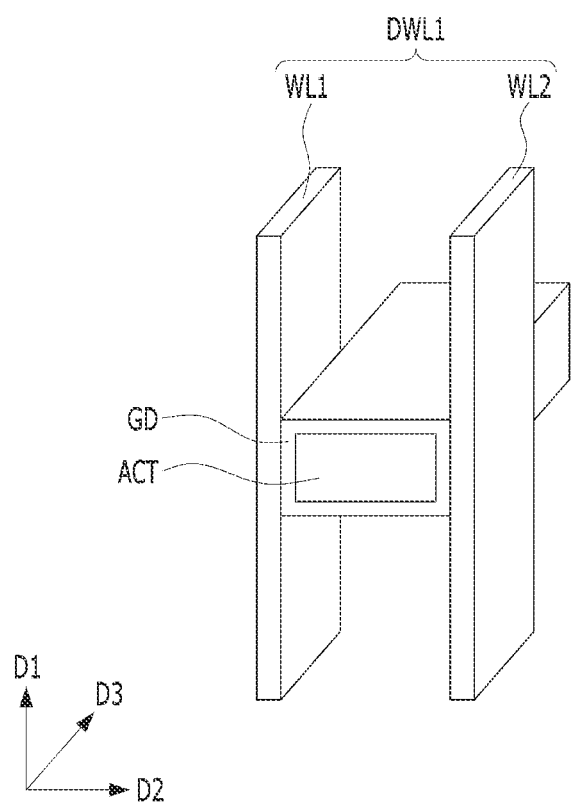

FIGS. 11A and 11B are schematic perspective views illustrating a semiconductor memory device in accordance with another embodiment of the present invention. FIG. 11B is a partial perspective view of the double word line DWL1.

Referring to FIG. 11A, the semiconductor memory device 500 may include a plurality of bit lines BL that are stacked over a substrate (not shown) In the first direction D1 which is perpendicular to the surface of the substrate and laterally oriented in the second direction D2 which intersects with the first direction D1, bit line pads BLP laterally extending from the edge portions of the bit lines BL, contact plugs coupled to the bit line pads BLP, active layers ACT laterally oriented in the third direction D3 which intersects with the first and second directions D1 and D2 from the bit line BL, double word lines DWL1 to DWL4 vertically oriented in the first direction D1 with the active layers ACT interposed therebetween, and a capacitor CAP coupled to an end of an active layer ACT.

Referring to FIG. 11B, the first word line WL1 and the second word line WL2 may extend vertically with the active layers ACT interposed therebetween. In other words, the first word line WL1 and the second word line WL2 may be parallel to each other to form one double word line DWL1. A gate dielectric layer GD surrounding the active layer ACT may be formed between the active layer ACT and the double word line DWL1.

Figure 12A:
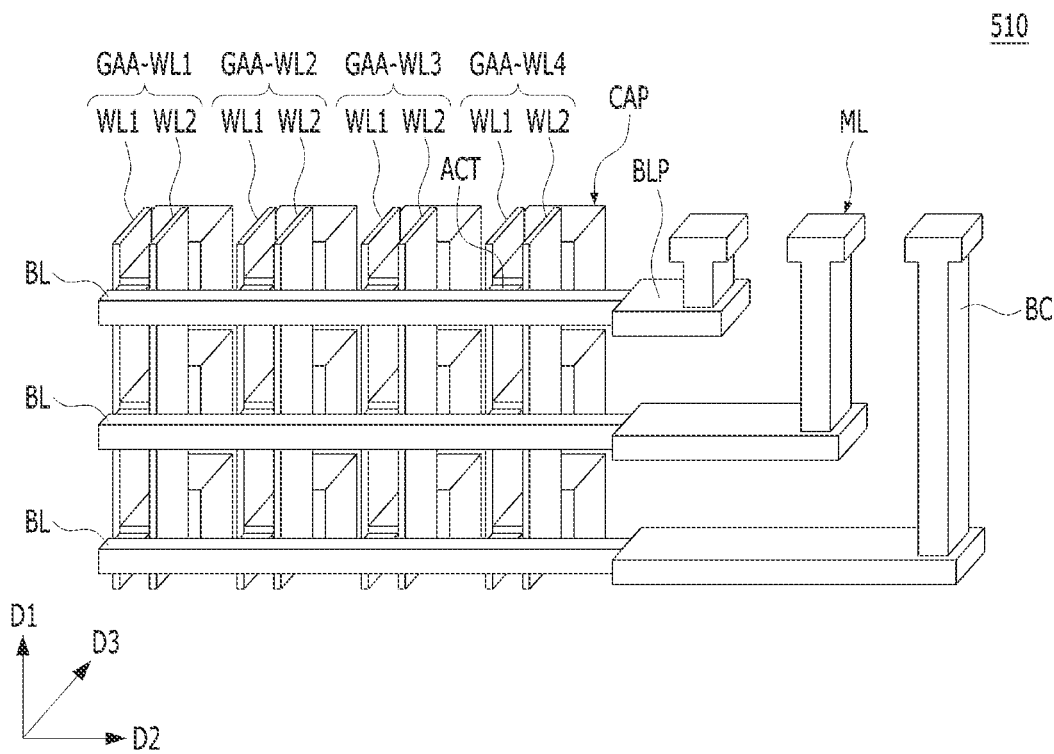
FIGS. 12A and 12B are schematic perspective views illustrating a semiconductor memory device in accordance with another embodiment of the present invention.
Figure 12B:
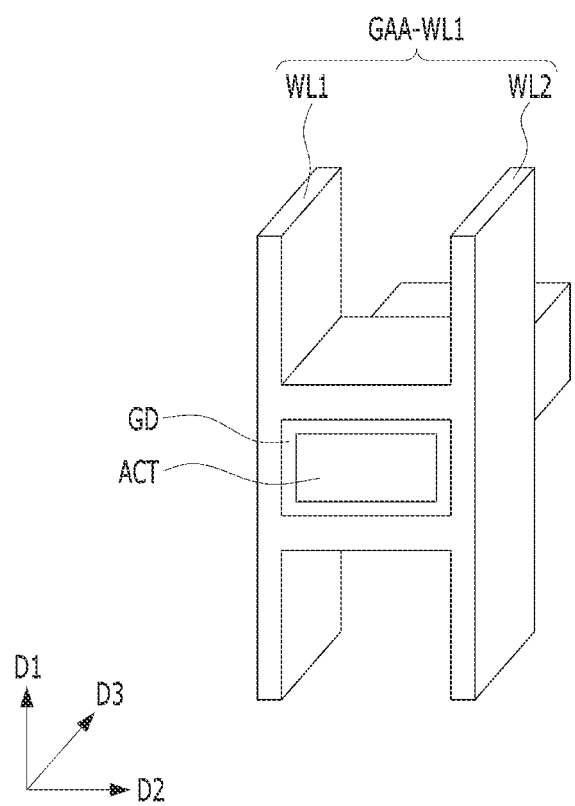

FIGS. 12A and 12B are schematic perspective views illustrating a semiconductor memory device 510 in accordance with another embodiment of the present invention. FIG. 12B is a partial perspective view illustrating a gate all-around word line GAA-WL1.

Referring to FIG. 12A, the semiconductor memory device 510 may include a plurality of bit lines BL that are stacked over a substrate (not shown) in the first direction D1 which is perpendicular to the surface of the substrate and laterally oriented in the second direction D2 which intersects with the first direction D1, bit line pads BLP laterally extending from the edge portions of the bit lines BL, contact plugs coupled to the bit line pads BLP, active layers ACT laterally oriented in the third direction D3 which intersects with the first and second directions D1 and D2 from the bit line BL, gate all-around word lines GAA-WL1 to GAA-WL4 vertically oriented in the first direction D1, and capacitors CAP coupled to the ends of the active layers ACT. The contact plugs BC may be coupled to the metal lines ML.

Referring to FIG. 12B, a portion of the first word line WL1 may extend between the active layers ACT to contact the second word line WL2. In other words, the first word line WL1 and the second word line WL2 may be coupled to each other to be integrated so as to form one gate all-around word line GAA-WL1. A gate dielectric layer GD surrounding the active layer ACT may be formed between the active layer ACT and the gate all-around word lines GAA-WL1.

The bit line pads BLP of FIGS. 11A and 12A may be modified to have diverse shapes as referenced in FIGS. 3, 5, 6, 7 and 8.

The semiconductor memory devices 500 and 510 of FIGS. 11A and 12A may include a word line of a single structure.

According to the embodiment of the present invention, word line resistance may be improved by forming thick word line pads that are coupled to edge portions of double word lines.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
    a conductive line stack including a plurality of first conductive lines that are stacked over a substrate in a direction perpendicular to a surface of the substrate;
    conductive pads extending laterally from edge portions of the plurality of first conductive lines, respectively; and
    contact plugs coupled to the conductive pads, respectively,
    wherein each of the plurality of first conductive lines includes a pair of a first sub-conductive line and a second sub-conductive line, and
    each of the conductive pads extends to be positioned in a gap between an edge portion of the first sub-conductive line and an edge portion of the second sub-conductive line.

2. The semiconductor memory device of claim 1, wherein the conductive pads have different lateral lengths.

3. The semiconductor memory device of claim 1, wherein the edge portions of the plurality of first conductive lines are self-aligned.

4. The semiconductor memory device of claim 1, wherein the edge portions of the plurality of first conductive lines are in direct contact with the conductive pads, respectively.

5. The semiconductor memory device of claim 1, wherein the conductive pads include:
    a first edge portion coupled to the edge portions of the plurality of first conductive lines; and
    a second edge portion coupled to the contact plugs,
    wherein the second edge portion has a stepwise shape.

6. The semiconductor memory device of claim 1, wherein each of the plurality of first conductive lines and the conductive pads includes a metal-based material.

7. The semiconductor memory device of claim 1, wherein each of the conductive pads further includes a liner layer and a bulk layer, and
    wherein the liner layer directly contacts the edge portions of the plurality of first conductive lines.

8. The semiconductor memory device of claim 1, wherein each of the conductive pads further includes a protrusion portion, and the protrusion portions have a shape filling the gap between the edge portion of the first sub-conductive line and the edge portion of the second sub-conductive line.

9. The semiconductor memory device of claim 1,
    wherein each of the conductive pads includes landing portions coupled to the contact plugs and a protrusion portion coupled to the edge portions of the first and second sub-conductive lines,
    wherein each of the protrusion portions is positioned in the gap between the edge portion of the first sub-conductive line and the edge portion of the second sub-conductive line, and
    wherein the landing portions have a height which is greater than a height of the gap between the edge portion of the first sub-conductive line and the edge portion of the second sub-conductive line.

10. The semiconductor memory device of claim 1, further comprising:
    active layers laterally oriented in a direction parallel to the surface of the substrate,
    wherein the active layers are laterally spaced apart from the conductive pads and positioned between the first sub-conductive line and the second sub-conductive line.

11. The semiconductor memory device of claim 10, further comprising:
    a second conductive line coupled to one side of the active layers and extending in the direction perpendicular to the surface of the substrate; and
    capacitors coupled to another side of the active layers.

12. The semiconductor memory device of claim 10, wherein the active layers includes a semiconductor material or an oxide semiconductor material.

13. A semiconductor memory device comprising:
    a plurality of active layers vertically stacked over a substrate;
    a bit line commonly coupled to first ends of the plurality of active layers and extending in a direction perpendicular to a surface of the substrate;
    capacitors coupled to second ends of the plurality of active layers, respectively;
    a word line stack including double word lines extending laterally in a direction intersecting with each of the active layers are stacked;
    word line pads laterally extending from edge portions of each of the double word lines, respectively; and
    contact plugs coupled to the word line pads, respectively,
    wherein each of the double word lines includes a pair of a first word line and a second word line, and
    each of the word line pads extends to be positioned in a gap between an edge portion of the first word line and an edge portion of the second word line.

14. The semiconductor memory device of claim 13, wherein the edge portions of the double word lines are self-aligned.

15. The semiconductor memory device of claim 13, wherein the edge portions of the double word lines are in direct contact with the word line pads.

16. The semiconductor memory device of claim 13, wherein the word line pads include:
a first edge portion coupled to the edge portions of the double word lines; and
a second edge portion coupled to the contact plugs,
wherein the second edge portion has a stepwise shape.

17. The semiconductor memory device of claim 13, wherein each of the double word lines and the word line pads includes a metal-based material.

18. The semiconductor memory device of claim 13,
wherein each of the word line pads further includes a liner layer and a bulk layer, and
wherein the liner layer directly contacts the edge portions of the double word lines.

19. The semiconductor memory device of claim 13, wherein each of the word line pads further includes a protrusion portion, and the protrusion portions have a shape filling the gap between the edge portion of the first word line and the edge portion of the second word line.

20. The semiconductor memory device of claim 13,
wherein each of the word line pads includes landing portions coupled to the contact plugs and a protrusion portion coupled to the edge portions of the first and second word lines, and
wherein each of the protrusion portions is positioned in the gap between the edge portion of the first word line and the edge portion of the second word line, and
wherein the landing portions have a height which is greater than a height of the gap between the edge portion of the first word line and the edge portion of the second word line.

21. The semiconductor memory device of claim 13, wherein the active layers are laterally spaced apart from the word line pads and positioned between the first word line and the second word line.

* * * * *